United States Patent [19]

Takemura

[11] Patent Number: 5,377,141
[45] Date of Patent: Dec. 27, 1994

[54] SUPERCONDUCTING MAGNETIC MEMORY DEVICE HAVING INTENTIONALLY INDUCED NON-SUPERCONDUCTING REGIONS

[75] Inventor: Yasuhiko Takemura, Kanagawa, Japan

[73] Assignee: Semiconductor Energy Laboratory Co., Ltd., Kanagawa, Japan

[21] Appl. No.: 719,040

[22] Filed: Jun. 21, 1991

Related U.S. Application Data

[63] Continuation-in-part of Ser. No. 332,963, Apr. 4, 1989, abandoned.

[30] Foreign Application Priority Data

Dec. 4, 1988 [JP] Japan .................. 63-89550
Dec. 4, 1988 [JP] Japan .................. 63-89551

[51] Int. Cl.$^5$ .............................................. G11C 11/44
[52] U.S. Cl. ..................................... 365/160; 365/162; 505/831; 505/832
[58] Field of Search ................... 365/160, 161, 162; 307/201, 245, 306, 311; 357/5, 30, 59; 505/1, 700, 848, 860, 874, 831, 832

[56] References Cited

U.S. PATENT DOCUMENTS

| | | | |
|---|---|---|---|
| 3,995,278 | 11/1976 | Young | 365/160 |
| 4,082,991 | 4/1978 | Constant | 365/160 |
| 4,365,317 | 12/1982 | Gheewala | 365/162 |
| 4,601,015 | 7/1986 | Ishida | 365/162 |
| 4,943,556 | 7/1990 | Szu | 365/160 |
| 5,011,817 | 4/1991 | Hidaka et al. | 365/160 |
| 5,039,656 | 8/1991 | Hidaka et al. | 365/160 |
| 5,070,070 | 12/1991 | Askew et al. | 365/160 |

FOREIGN PATENT DOCUMENTS 1386618 2/1989 Japan .................. 505/848

Primary Examiner—Joseph L. Dixon
Assistant Examiner—Jack A. Lane
Attorney, Agent, or Firm—Sixbey, Friedman, Leedom & Ferguson

[57] ABSTRACT

A new type of superconducting memory is described. The composition of superconducting ceramic material used in the memory has been altered in order to expedite the formation of non-superconducting regions formed of grain boundaries. Non-superconducting regions may also be formed of lattice defects. Magnetic flux is trapped within the non-superconducting regions (grain boundaries or lattice defects). Information can be stored in terms of whether or not magnetic flux is trapped.

16 Claims, 5 Drawing Sheets

SUPERCONDUCTING MAGNETIC MEMORY DEVICE HAVING INTENTIONALLY INDUCED NON-SUPERCONDUCTING REGIONS

RELATED APPLICATION

This application is a continuation-in-part of pending Application Ser. No. 07/332,963 filed Apr. 4, 1989 now abandoned.

BACKGROUND OF THE INVENTION

The present invention relates to a new type of memory cell, and more particularly relates to a superconducting magnetic memory cell.

Since the recent discovery of high temperature superconducting oxide ceramics, many peculiar characteristics of the ceramics have been found. Many of them are disadvantageous rather than advantageous. For example, when sintered, the ceramic structure includes a large amount of cracks and gaps which may obstruct superconducting currents. So far, it has been considered desirable to avoid such cracks and gaps.

On the other hand, Josephson devices are representative superconducting memory devices. The memory of this type is considered promising due to its high response speed. It is very difficult however, to form, within a ceramic oxide superconductor, Josephson junctions of the order of several hundreds of micrometers in thickness because in order to make the ceramic superconducting, the ceramic material has to be fired at a high temperature, in which case the ceramic material tends to react with other materials (consisting of the junctions) at such a high temperature.

SUMMARY OF THE INVENTION

It is an object of the present invention to provide a superconducting memory cell which can be produced by an easy procedure.

In accordance with the basic theory of superconductivity, a magnetic field can not penetrate the inside of a superconducting region or the region confined by a superconducting loop, and therefore, when a superconducting ceramic body is subjected to a magnetic field, a magnetic flux is repelled and trapped in a non-superconducting region. The non-superconducting regions are formed of grain boundaries or lattice defects. The magnetic flux vanishes when the external magnetic field is removed. Contrary to this, the inventor has confirmed that even after the removal of the external magnetic field, the trapped magnetic field remains in the case of superconducting ceramics. The region trapping magnetic flux can yield a voltage indicative of the existence of the flux, in response to a relatively small input current. This fact suggests the possibility to construct a new type of an information storing cell based on superconductivity.

In accordance with the present invention, non-superconducting regions are intentionally formed in a superconducting ceramic. The non-superconducting regions may be formed of grain boundaries and also may be formed of lattice defects. In either case, the intentional formation of non-superconducting regions allows for trapping of magnetic fluxes. In accordance with one aspect of the present invention, the non-superconducting regions are formed utilizing a starting material having a composition which intentionally deviates from the composition conforming to the superconducting ceramic. According to this aspect, grain boundaries can be formed by including a non-superconducting region, for example in the case of $YBa_2Cu_3$, a $Y_2BaCuO_5$ region-1 phase is provided as the non-superconducting region forming grain boundaries. In accordance with another aspect of the present invention, impurities may be added to the superconducting ceramic. According to this aspect, the grain boundaries are formed of a compound of added impurities. Thus, with either aspect, non-superconducting regions are formed for trapping magnetic fluxes, with non-superconducting regions formed by the use of a deviated starting material or the addition of impurities.

DETAILED DESCRIPTION OF THE PREFERRED EMBODIMENTS

Hereinbelow, a superconducting ceramic memory cell in accordance with a specific embodiment of the present invention is described.

Figure 1:
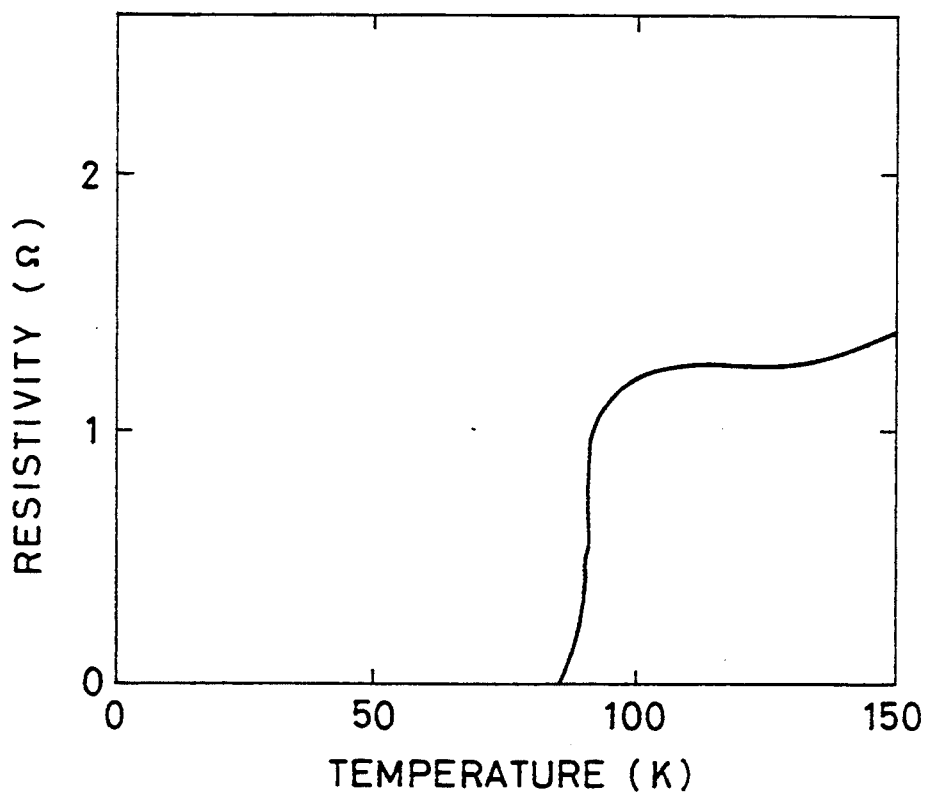
FIG. 1 is a graphical diagram showing the current-voltage characteristic of a superconducting ceramic material.

Yttrium oxide, barium carbonate and copper oxide which were prepared respectively to have an impurity of 99.99% or higher were ground, powdered and mixed together in order that the atomic ratio of Y:Ba:Cu is about 1.0:2.2:3.0, while the optimal ratio required for superconductivity is 1.0:2.0:3.0. This intentional deviation was effective to increase grain boundary regions. After sufficiently mixing, the mixture was sintered by firing at 900° C. for 12 hours in air. The sintered material was finely ground again and compressed under a pressure of 1000 kg/cm$^2$ into a pellet. The pellet was fired again at 900° C. in air for three hours followed by slow cooling at 10° C./min. From the pellet, rectangular rods of 10 mm × 1 mm × 1 mm were diced. Electrode contacts were provided on the surface of the rods. Current-voltage characteristics were measured as shown in FIG. 1 by four-terminal method.

Figure 2:
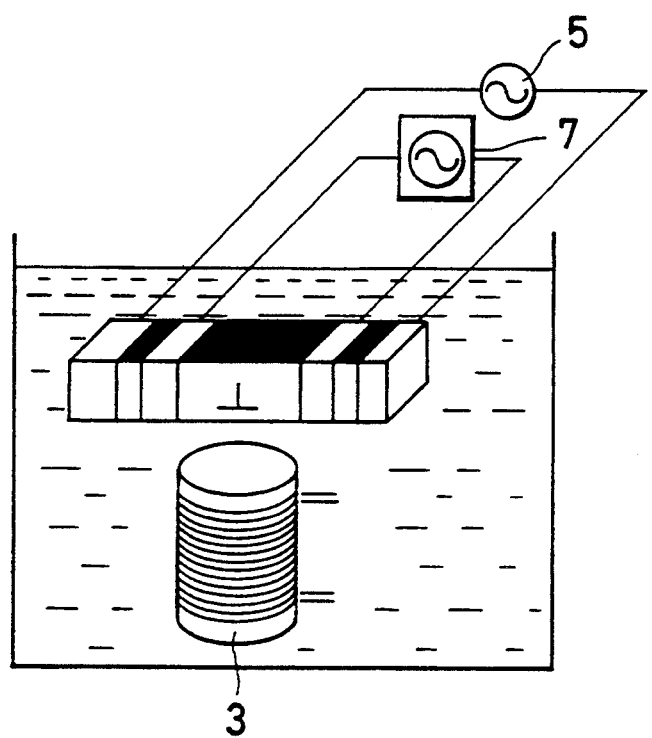
FIG. 2 is a schematic diagram showing a magnetic memory in accordance with the present invention.
Figure 3:
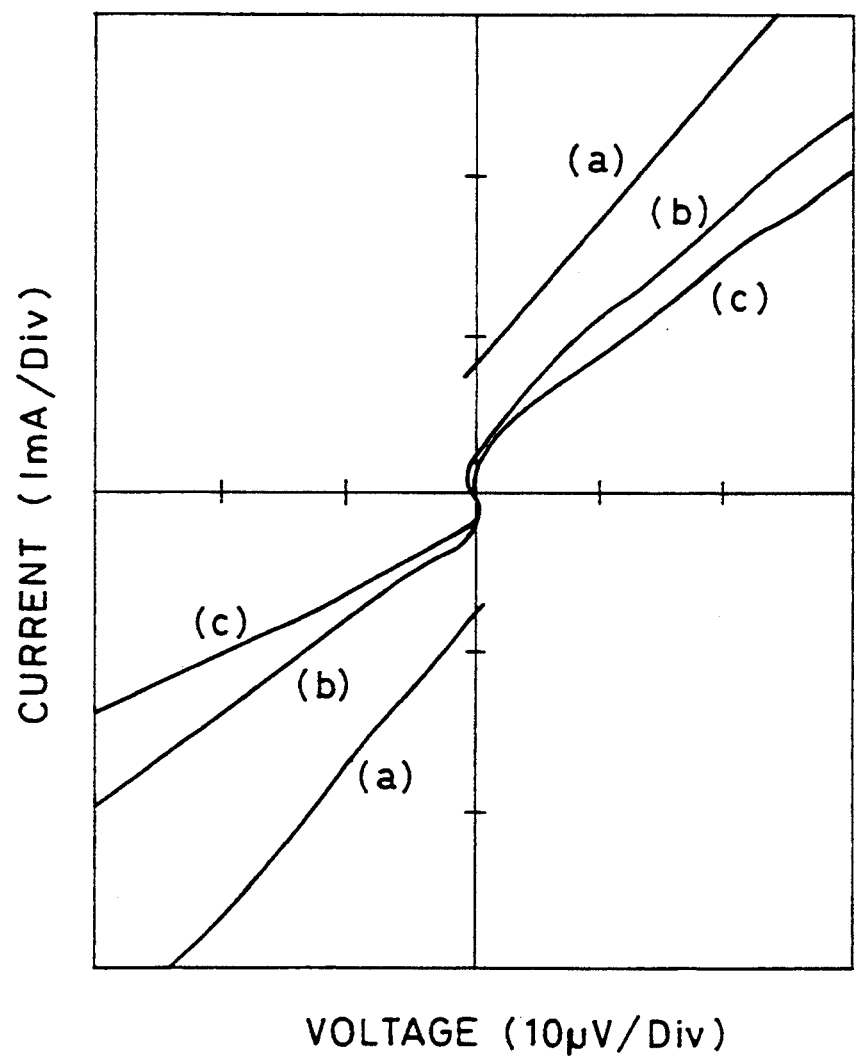
FIG. 3 is a graphical diagram showing current-voltage characteristics of a magnetic memory in various states in accordance with the present invention.

The rod was placed in liquid nitrogen together with a magnetic coil 3 disposed just adjacent to the rod 1. An AC source 5 and an oscilloscope 7 were connected to the rod 1 through the contacts as illustrated in FIG. 2 in order to investigate the current-voltage relationship. When no current was supplied to the coil 3, current-voltage curve (a) was observed in the display of the oscilloscope 7 as shown in FIG. 3. When the coil 3 was subjected to a magnetic field of 40 Gauss by supplying a current to the coil, current-voltage curve (b) was observed. Then, the application of the magnetic field was removed. However, the current-voltage curve was not returned to curve (a) but further changed to curve (c). No change was observed in the characteristic represented by curve (c) even after the rod was left in the liquid nitrogen for several hours.

Figure 4A:
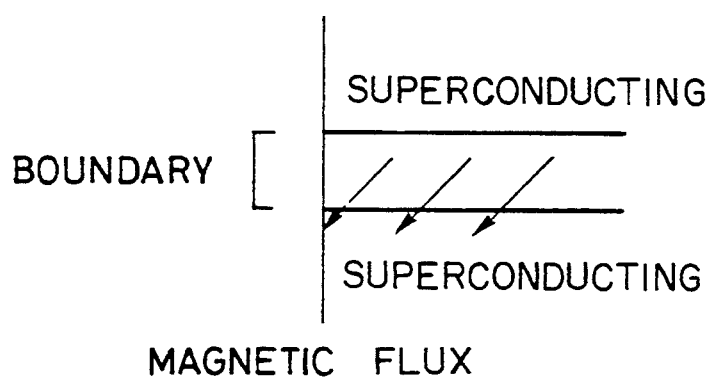
FIGS. 4(A) and 4(B) are explanatory views showing the mechanism of trapping magnetic flux in accordance with the present invention.
Figure 4B:
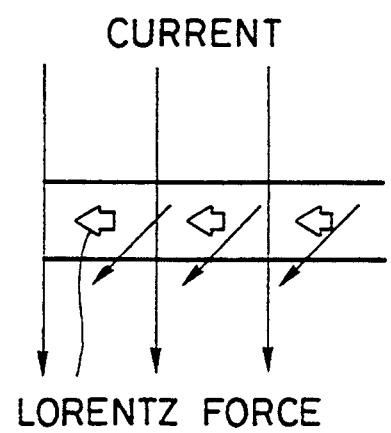
Figure 5:
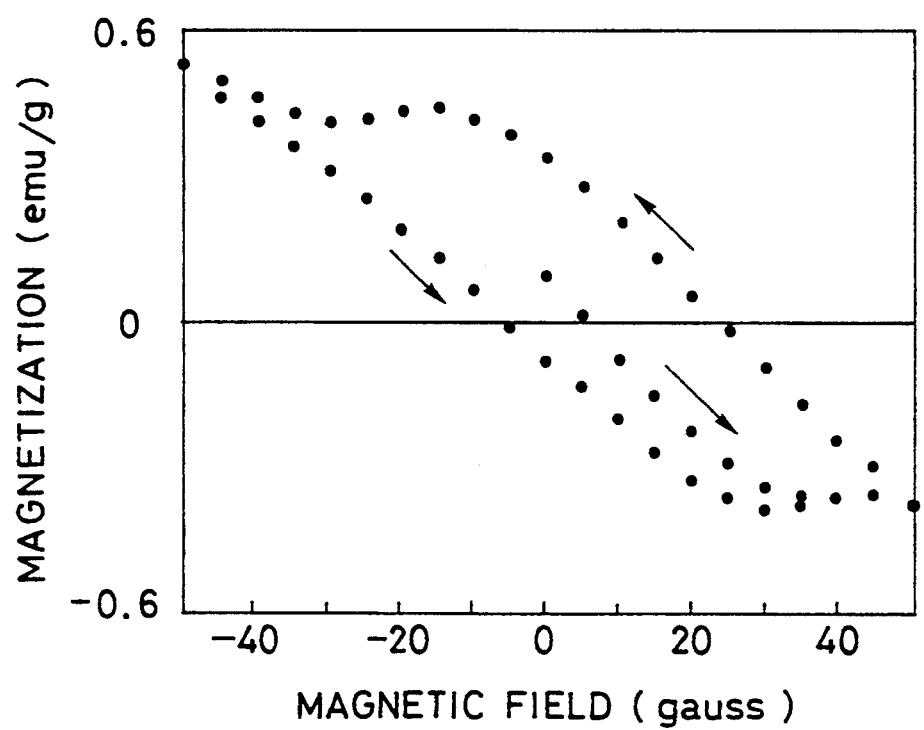
FIG. 5 is a graphical diagram showing the hysteresis loop of a magnetic memory in accordance with the present invention.

This phenomenon can be explained as follows. Namely, grain boundaries form natural Josephson junctions as illustrated in FIG. 4(A), within which junctions a magnetic flux is trapped. The formation of Josephson junctions (non-superconducting regions) of this type is expedited by slightly changing formation conditions (including the composition) of superconducting ceramics. In this state, when electric current flows through the superconducting ceramic material, the magnetic flux distribution is altered by Lorentz force as illustrated in FIG. 4(B). This magnetic flux does not vanish even after the external magnetic field is removed. This was proved also by investigating the hysteresis loop of the ceramic material trapping magnetic flux therein. FIG. 5 is a graphical diagram showing such a hysteresis in accordance with an experiment carried out at 6K. The existence of the remaining magnetic flux can be detected by applying an electric current across the junctions and sensing a voltage induced along the junctions. The information storing method of this type can be applied for digital memories in terms of whether or not magnetic flux is trapped. The stored information can be deleted by elevating the temperature to a level higher than the critical temperature of the superconducting ceramic material.

Instead of bulk materials, superconducting ceramic thin films can be used in accordance with the present invention. A thin film of $YBa_2Cu_3O_{7-x}$ was deposited to a thickness of 1 micrometer on a single-crystalline magnesium oxide body by radio frequency sputtering. The critical temperature of the thin film was measured to be 85° C. The thin film was covered with an aluminum coating of a 1000 Å thickness and thermally annealed at 700° C. in air for 30 minutes in order to diffuse aluminum into the film. Similar characteristics were observed with this thin film.

The trapping of magnetic flux can be further expedited by making use of a ferromagnetic element such as iron, cobalt and nickel. If iron atoms exist in the barrier regions, comparatively large values of magnetization are produced by virtue of iron atoms contained in the regions when magnetic flux is trapped within the barrier. In what follows, another embodiment will be described in accordance with this concept.

The procedure was the same as that of the initial example, except for the use of iron. Namely, the starting material consists of yttrium oxide, barium carbonate, copper oxide ant ferric oxide, which were prepared respectively to have an impurity of 99.99% or higher. The materials were ground, powdered and mixed together in order that atomic ratio of Y:Ba:Cu:Fe is about 1.0:2.0:2.9:0.1. A similar memory property was confirmed in the same manner as described in the above embodiment.

Instead of bulk materials, superconducting ceramic thin films can also be used in accordance with this embodiment. A thin film of $YBa_2Cu_{2.9}Fe_{0.1}O_{7-x}$ was deposited to a thickness of 1 micrometer on a single crystalline magnesium oxide body by rf sputtering. The critical temperature of the thin film was measured to be 80° C. The thin film was mechanically patterned into scraps of 10 mm in length and 0.2 mm in width, and provided with aluminum contacts for investigation of current-voltage characteristics. As a result, similar characteristics were observed with this thin film.

Superconducting ceramics for use in accordance with the present invention also may be prepared consistent with the stoichiometric formulae $(A_{1-x}B_x)_yCu_zO_w$, where A is one or more elements of Group IIIa of the Periodic Table, e.g. the rare earth elements, B is one or more elements of Group IIa of the Periodic Table, e.g. alkaline earth elements, and x=0.1–1; y=2.0–4.0, preferably 2.5–3.5; z=1.0–4.0, preferably 1.5–3.5; and w=4.0–10.0, preferably 6.0–8.0. Also, superconducting ceramics for use in accordance with the present invention may be prepared consistent with the stoichiometric formulae $(A_{1-x}B_x)_yCu_zO_w$, where A is one or more elements of Group Vb of the Periodic Table such as Bi, Sb, and As; B is one or more elements of Group IIa of the Periodic Table, e.g. alkaline earth elements, and x=0.3–1; y=2.0–4.0, preferably 2.5–3.5; z=1.0–4.0, preferably 1.5–3.5; and w=4.0–10.0, preferably 6.0–8.0. Examples of the latter general formulae are $Bi_4Sr_yCa_3Cu_4O_x$ $Bi_4Sr_yCa_3Cu_4O_x$, $Bi_4Sr_yCa_3Cu_4O_x$ $Bi_4Sr_yCa_3Cu_4O_x$, $Bi_4Sr_yCa_3Cu_4O_x$ $Bi_4Sr_yCa_3Cu_4O_x$ (y is around 1.5).

While several embodiments have been specifically described, it is to be appreciated that the present invention is not limited to the particular examples described and that modifications and variations can be made without departure from the scope of the invention as defined by the appended claims.

I claim:

1. A superconducting magnetic memory system comprising:
    a superconducting ceramic having intentionally induced, artificially occurring non-superconducting regions;
    cooling means for cooling said ceramic to a level lower than the critical temperature of said superconducting ceramic;
    means for supplying electric current passing through said ceramic;
    means for applying a magnetic field to said ceramic; and
    a voltage detector for detecting differential potentials across said non-superconducting regions in the direction of said electric current passing through said ceramic, wherein said differential potentials are caused by magnetic fluxes trapped by said non-superconducting regions.

2. An information storing and detecting method comprising:
    cooling a superconducting ceramic below the critical temperature of said ceramic, said superconducting ceramic having intentionally induced, artificially occurring non-superconducting regions;
    applying a magnetic field to said ceramic,
    removing said magnetic field, wherein magnetic fluxes are trapped by said non-superconducting regions;
    supplying electric current to said ceramic in order that a differential potential is produced at said non-superconducting regions by virtue of existence of said magnetic fluxes; and
    detecting said differential potential.

3. A superconducting magnetic memory system comprising:
    a superconducting ceramic having artificially occurring non-superconducting regions:
    cooling means for cooling said ceramic to a level lower than the critical temperature of said superconducting ceramic;
    means for supplying electric current passing through said ceramic: and a voltage detector for detecting differential potentials across said non-superconducting regions in the direction of said electric current passing through said ceramic, wherein said differential potentials are caused by magnetic fluxes trapped by said non-superconducting regions, wherein said non-superconducting regions are formed by the use of a starting material of a composition which is intentionally deviated from a composition conforming to said superconducting ceramic.

4. The memory of claim 3 wherein said non-superconducting regions are formed of grain boundaries.

5. The memory of claim 3 wherein said ceramic comprises a copper oxide.

6. A superconducting magnetic memory system comprising:

a superconducting ceramic having artificially occurring non-superconducting regions;

cooling means for cooling said ceramic to a level lower than the critical temperature of said superconducting ceramic;

means for supplying electric current passing through said ceramic;

means for applying a magnetic field to said ceramic; and a voltage detector for detecting differential potentials across said non-superconducting regions in the direction of said electric current passing through said ceramic, wherein said differential potentials are caused by magnetic fluxes trapped by said non-superconducting regions, wherein said non-superconducting regions are formed by adding an impurity into said ceramic.

7. The memory of claim 6 wherein said non-superconducting regions are formed of grain boundaries.

8. The memory of claim 7 wherein said impurity is separated at said grain boundaries.

9. The memory of claim 6 wherein said ceramic comprises a copper oxide.

10. An information storing and detecting method comprising:

cooling a superconducting ceramic below the critical temperature of said ceramic, said superconducting ceramic having non-superconducting regions;

applying a magnetic field to said ceramic, removing said magnetic field, wherein magnetic fluxes are trapped by said non-superconducting regions;

supplying an electric current to said ceramic in order that a differential potential is produced at said non-superconducting regions by virtue of existence of said magnetic fluxes; and detecting said differential potential, wherein said non-superconducting regions are formed by the use of a starting material of a composition which is intentionally deviated from a composition conforming to said superconducting ceramic.

11. The method of claim 10 wherein said non-superconducting regions are formed of grain boundaries.

12. The method of claim 10 wherein said ceramic comprises a copper oxide.

13. An information storing and detecting method comprising:

cooling a superconducting ceramic below the critical temperature of said ceramic, said superconducting ceramic having artificially occurring non-superconducting regions;

applying a magnetic field to said ceramic, removing said magnetic field, wherein magnetic fluxes are trapped by said non-superconducting regions;

supplying electric current to said ceramic in order that a differential potential is produced at said non-superconducting regions by virtue of existence of said magnetic fluxes; and detecting said differential potential, wherein said non-superconducting regions are formed by adding an impurity into said ceramic.

14. The method of claim 13 wherein said non-superconducting regions are formed of grain boundaries.

15. The method of claim 14 wherein said impurity is separated at said grain boundaries.

16. The method of claim 13 wherein said ceramic comprises a copper oxide.

* * * * *